US008717213B1

(12) United States Patent
Wong (10) Patent No.: US 8,717,213 B1
(45) Date of Patent: May 6, 2014

(54) HYBRID RESISTIVE DIGITAL-TO-ANALOG DEVICES

(71) Applicant: Semtech Corporation, Camarillo, CA (US)

(72) Inventor: Ark Chew Wong, Irvine, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 13/673,103

(22) Filed: Nov. 9, 2012

(51) Int. Cl.
*H03M 1/66* (2006.01)
(52) U.S. Cl.
USPC .......................................... 341/144; 341/145
(58) Field of Classification Search
USPC .......... 341/144, 145, 153, 154, 138; 345/211; 327/552
See application file for complete search history.

(56) References Cited

U.S. PATENT DOCUMENTS 3,828,345 A * 8/1974 Lode .............................. 341/118

OTHER PUBLICATIONS

Kamal, "8-bit Digital to Analog converter (DAC)", http://www.ikalogic.com/8-bit-digital-to-analog-converter-dac/, last accessed Feb. 18, 2013, 5 pages.
"Balun", http://en.wikipedia.org/wiki/Balun, last accessed Feb. 18, 2013, 5 pages.
"Choke (electronics)" http://en.wikipedia.org/wiki/Choke_(electronics), last accessed Feb. 18, 2013, 3 pages.
"R/2R Ladder Networks—Application Note", (c)TT electronics plc LIT-AN-R2RLADDER Issue 2, http://www.irctt.com/pdf/laddernetworks.pdf, last accessed Feb. 18, 2013, 5 pages.
"Bi Technologies R2R Resistor Ladder Networks", http://www.bitechnologies.com/pdfs/resistorladder.pdf, last accessed Feb. 18, 2013, 2 pages.

* cited by examiner

*Primary Examiner* — Joseph Lauture
(74) *Attorney, Agent, or Firm* — Amin, Turocy & Watson, LLP (57) ABSTRACT

A differential resistor-based digital-to-analog converter (RDAC) can include a positive digital-to-analog converter (PDAC) stage and a negative digital-to-analog converter (NDAC) stage. A first network of resistors of the PDAC stage can be electrically coupled to a second network of resistors of the NDAC stage utilizing an intermediary network of resistors. Further, a differential receiver can include a first input and a second input. The first input can be electrically coupled to a first resistor of the intermediary network of resistors, and the second input can be electrically coupled to a second resistor of the intermediary network of resistors. Furthermore, a portion of the first network of resistors can be electrically coupled to a positive output of the RDAC, and another portion of the second network of resistors can be electrically coupled to a negative output of the RDAC.

20 Claims, 9 Drawing Sheets

$$RT = \frac{RT_A}{2^N - 1}$$

$$R1 = \frac{R1_A}{2^N - 1}$$

$$R2 = \frac{V2 \times R1}{V1} = \frac{V2 \times R1_A}{V1(2^N - 1)} = \frac{R1_A}{2(2^N - 1)}$$

$$RT = \left(\frac{RTA'}{2^N - 1}\right) + RT'$$

$$R1' = (2 \times R2')\left(\frac{RT' + RL}{RT + RL}\right)$$

$$R2' = \frac{V2 \times R1'}{V3}$$

HYBRID RESISTIVE DIGITAL-TO-ANALOG DEVICES

TECHNICAL FIELD

This disclosure relates generally to digital-to-analog circuits including, but not limited to, a hybrid resistive digital-to-analog devices.

BACKGROUND

Conventional transceiver technologies utilize active and/or passive filters to perform echo rejection of transmit signal(s) leaking into receive path(s). However, such technologies are associated with increased power consumption and increased use of valuable "silicon real estate."

The above-described deficiencies of today's transceiver circuits and related technologies are merely intended to provide an overview of some of the problems of conventional technology, and are not intended to be exhaustive, representative, or always applicable. Other problems with the state of the art, and corresponding benefits of some of the various non-limiting embodiments described herein, may become further apparent upon review of the following detailed description.

SUMMARY

A simplified summary is provided herein to help enable a basic or general understanding of various aspects of illustrative, non-limiting embodiments that follow in the more detailed description and the accompanying drawings. This summary is not intended, however, as an extensive or exhaustive overview. Instead, the sole purpose of this summary is to present some concepts related to some illustrative non-limiting embodiments in a simplified form as a prelude to the more detailed description of the various embodiments that follow. It will also be appreciated that the detailed description may include additional or alternative embodiments beyond those described in this summary.

In accordance with one or more embodiments and corresponding disclosure, various non-limiting aspects are described in connection with embedding a passive hybrid resistive network into a transmit path of a resistive digital-to-analog converter. In one or more aspects, the passive hybrid resistive network can be electrically coupled to a receive path of a transceiver to perform echo cancelation of signal(s), transmit image(s), etc. that can leak from the transmit path to the receive path, e.g., improving a dynamic range of an associated receiver.

In various embodiments, a transceiver can include a differential resistor-based digital-to-analog converter (RDAC) including a positive digital-to-analog converter (PDAC) stage and a negative digital-to-analog converter (NDAC) stage, e.g., the PDAC stage and the NDAC stage associated with a transmitter that outputs transmit (TX) signaling in response to receiving binary transmit (TX) data. A first network of resistors of the PDAC stage can be electrically coupled to a second network of resistors of the NDAC stage utilizing an intermediary network of resistors.

Additionally, the transceiver can include a differential receiver, e.g., that outputs receive (RX) data in response to receiving RX signaling. Further, a first input of the receiver can be electrically coupled to a first resistor of the intermediary network of resistors. In addition, a second input of the receiver can be electrically coupled to a second resistor of the intermediary network of resistors.

In one embodiment, a portion of the first network of resistors can be electrically coupled to a positive output of the RDAC, and another portion of the second network of resistors can be electrically coupled to a negative output of the RDAC. In another embodiment, the portion of the first network of resistors can be electrically coupled to the negative output of the RDAC via the intermediary network of resistors, and the other portion of the second network of resistors can be electrically coupled to the positive output of the RDAC via the intermediary network of resistors.

In an embodiment, the first resistor of the intermediary network of resistors can be electrically coupled to the positive output of the RDAC, and the second resistor of the intermediary network of resistors can be electrically coupled to the negative output of the RDAC.

In yet another embodiment, the PDAC stage can receive a first binary input, e.g., of the TX data, that is electrically coupled to the first network of resistors. Further, the NDAC stage can receive a second binary input, e.g., of the TX data, that is electrically coupled to the second network of resistors. Additionally, the first binary input can be inverted from the second binary input, or form a binary complement to the second binary input.

In an embodiment, a bit of the first binary input can be electrically coupled to the first network of resistors utilizing a series of inverters. In another embodiment, a bit of the second binary input can be electrically coupled to the second network of resistors utilizing a series of inverters.

In one embodiment, the intermediary network of resistors can include a third resistor electrically coupling the first network of resistors to the second resistor of the intermediary network of resistors.

In yet another embodiment, a bit of the first binary input can be electrically coupled to a first resistor of the first network of resistors utilizing a p-channel metal-oxide-semiconductor field-effect transistor (pMOSFET) connected in series with the first resistor. Further, the bit can be electrically coupled to a second resistor of the first network of resistors utilizing an n-channel metal-oxide-semiconductor field-effect transistor connected in series with the second resistor.

Another non-limiting implementation can include a semiconductor device including an RDAC circuit. The RDAC circuit can include a PDAC circuit that includes a first set of resistors, and an NDAC circuit that includes a second set of resistors that is electrically coupled to the first set of resistors via an intermediary set of resistors. Further, the RDAC circuit can include a differential receiver circuit including a first input electrically coupled to a first resistor of the intermediary set of resistors, and a second input electrically coupled to a second resistor of the intermediary set of resistors.

In yet another embodiment, the first resistor can be electrically coupled to a positive output of the differential resistive digital-to-analog converter circuit. Further, the positive output can be electrically coupled to the first set of resistors. Additionally, the second resistor can be electrically coupled to a negative output of the differential resistive digital-to-analog converter circuit, and the negative output can be electrically coupled to the second set of resistors.

In an embodiment, the PDAC circuit electrically couples a first binary input to the first set of resistors, and the NDAC circuit electrically couples a second binary input to the second set of resistors. Further, the first binary input is inverted from the second binary input, is a complementary binary value to the second binary input, etc.

In one embodiment, the PDAC circuit electrically couples the first binary input to the first set of resistors using a series of inverters, and the NDAC circuit electrically couples the second binary input to the second set of resistors using another series of inverters.

In another embodiment, a bit of the first binary input is electrically coupled to a resistor of the first set of resistors utilizing a pMOSFET electrically connected in series with the resistor and/or an nMOSFET electrically connected in series with the resistor.

Yet another non-limiting implementation can include a wireline transceiver, e.g., a Gigabit Ethernet (Gbe, 1GigE, IEEE 802.3-2008 based, etc.) transceiver, a very high speed digital subscriber line (VDSL) based transceiver, etc. that can include a first digital-to-analog converter (DAC) of an RDAC circuit, e.g., of a transmitter, that includes a first group of resistors. Further, the RDAC circuit can include a second DAC including a second group of resistors that is electrically coupled to the first group of resistors utilizing a third group of resistors.

Further, the wireline transceiver can include a receiver circuit including a first input and a second input. The first input can be electrically coupled to a first resistor of the intermediary set of resistors, and the second input can be electrically coupled to a second resistor of the intermediary set of resistors.

In an embodiment, the first resistor can be electrically coupled to a positive output of the differential resistive digital-to-analog converter circuit, and the second resistor is electrically coupled to a negative output of the differential resistive digital-to-analog converter circuit.

In one embodiment, a first binary input can be electronically coupled to the first group of resistors. Further, a second binary input can be electronically coupled to the second group of resistors—the first binary input inverted from, complementary to, etc. the second binary input.

In another embodiment, the first binary input can be electrically coupled to the first group of resistors via a series of inverters, and the second binary input can be electrically coupled to the second group of resistors via another series of inverters.

In yet another embodiment, the first binary input can be electrically coupled to the first group of resistors via a pMOSFET electrically connected in series, e.g., via a source/drain of the pMOSFET, with a resistor of the first group of resistors. Further, the first binary input can be electrically coupled to an nMOSFET electrically connected in series, e.g., via a source/drain of the nMOSFET, with another resistor of the first group of resistors.

Other embodiments and various non-limiting examples, scenarios, and implementations are described in more detail below.

BRIEF DESCRIPTION OF THE DRAWINGS

Various non-limiting embodiments are further described with reference to the accompanying drawings in which.

DETAILED DESCRIPTION

Overview

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular environment or standard. In other instances, well-known structures and devices are shown in block diagram form in order to facilitate describing the embodiments in additional detail.

As described above, conventional technologies for performing echo cancellation are associated with increased power consumption and increased use of semiconductor die space, e.g., silicon real estate. For example, such conventional technologies utilize active and/or passive filters/networks to perform transmit image rejection and/or to filter transmit signal information leaking and/or coupling, e.g., from transmit circuitry, etc. into a receive path coupled to an input of a receiver and/or receive circuitry.

Compared to such technology, various apparatus and systems described herein in various embodiments integrate a passive hybrid resistive network into a transmit path of a resistive digital-to-analog converter to perform echo cancelation of signal(s) leaking from the transmit path to a receive path of an associated receiver.

In one embodiment, a transceiver can include a differential resistor-based digital-to-analog converter (RDAC) including a positive digital-to-analog converter (PDAC) stage and a negative digital-to-analog converter (NDAC) stage. Further, a first network of resistors of the PDAC stage can be electrically coupled to a second network of resistors of the NDAC stage utilizing an intermediary network of resistors. Additionally, the transceiver can include a differential receiver including a first input that is electrically coupled to a first resistor of the intermediary network of resistors, and a second input electrically coupled to a second resistor of the intermediary network of resistors.

In another embodiment, a semiconductor device can include a differential resistive digital-to-analog converter (RDAC) circuit. The RDAC circuit can include a PDAC circuit that includes a first set of resistors, and an NDAC circuit that includes a second set of resistors that is electrically coupled to the first set of resistors via an intermediary set of resistors. Further, the RDAC circuit can include a differential receiver circuit including a first input electrically coupled to a first resistor of the intermediary set of resistors, and a second input electrically coupled to a second resistor of the intermediary set of resistors.

In yet another embodiment, a wireline transceiver can include a first digital-to-analog converter (DAC) of an RDAC circuit including a first group of resistors. Further, the RDAC circuit can include a second DAC including a second group of resistors that is electrically coupled to the first group of resistors utilizing a third group of resistors.

Such techniques can reduce power consumption of transceivers, e.g., wireline transceivers, etc. by utilizing a passive hybrid network in a transmit path of a resistive digital-to-analog converter for performing echo cancelation. Further, by reducing a use of integrated circuit and/or discrete circuit components associated with passive and/or active filters, e.g., band notch filters, band reject filters, etc. such techniques can reduce a cost, a bill of material (BOM), etc. associated with use of such transceivers. Further, such reduction in use of passive and/or active filters can conserve semiconductor die space and further limit power consumption of such transceivers.

Hybrid Resistive Digital-to-Analog Devices

Figure 1:
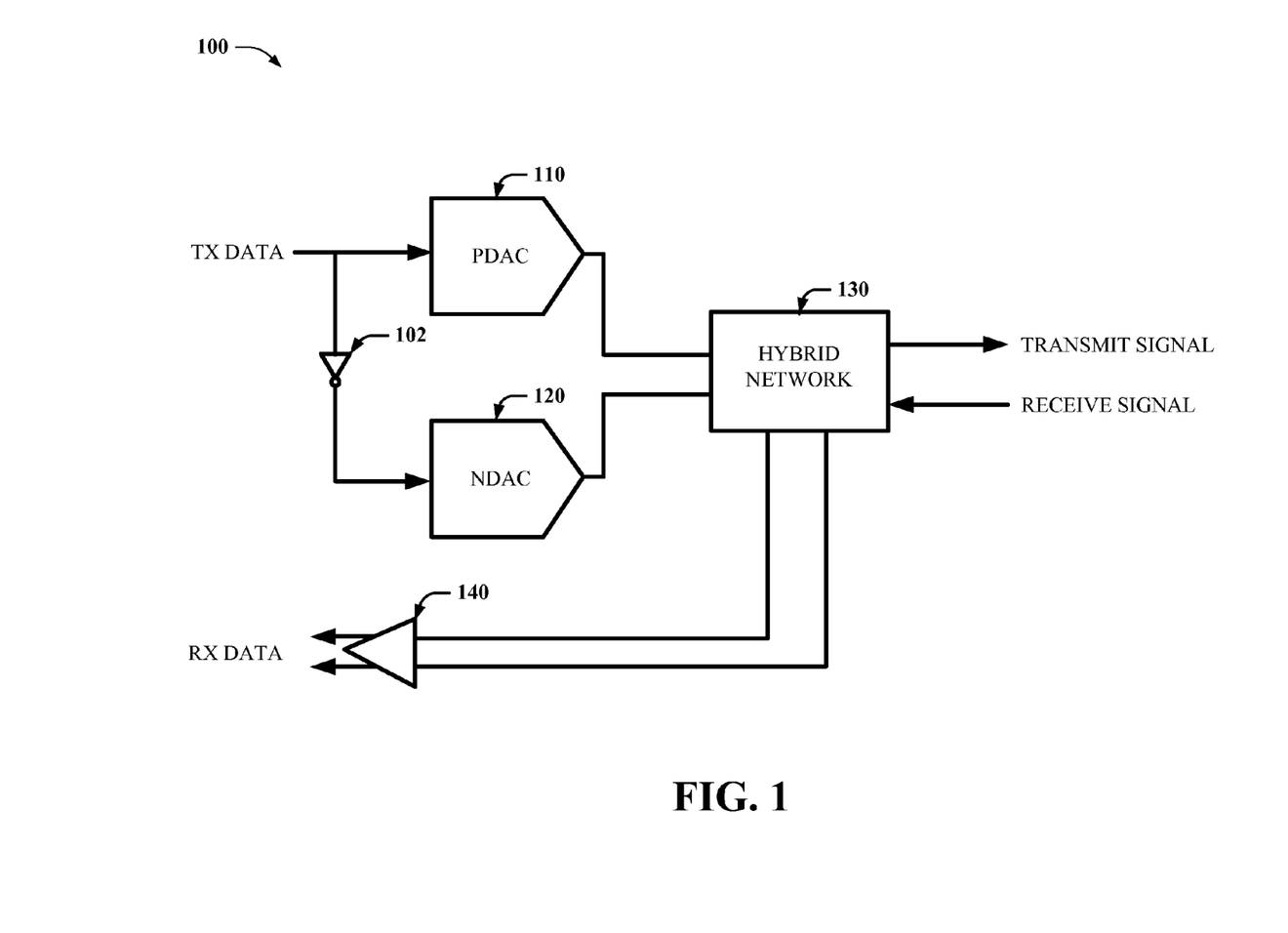
FIG. 1 illustrates a block diagram of a transceiver, in accordance with an embodiment.

FIG. 1 illustrates a block diagram 100 of a transceiver, in accordance with an embodiment. The transceiver can include positive digital-to-analog converter (PDAC) stage 110, negative digital-to-analog converter (NDAC) stage 120, hybrid network 130, and differential receiver 140. PDAC stage 110 can receive transmit (TX) data, e.g., in binary form. Further, NDAC stage 120 can receive a binary complement, or inversion, of the TX data via inversion stage 102, which can include, e.g., MOSFET-based inverters. In another aspect illustrated by FIG. 9 below, the transceiver can receive a binary complement of the TX data, e.g., at NDAC 120 stage, via a data bus electrically coupled to a computational system, device, processor, etc. In such an embodiment, the transceiver does not include inversion stage 102.

A first network of resistors (not shown) of PDAC 110 stage can be electrically coupled to a second network of resistors (not shown) of NDAC 120 stage via an intermediary network of resistors (not shown) of hybrid network 130. Further, hybrid network 130 can output a transmit signal, e.g., TX signaling, in response to being electrically coupled to TX data via PDAC 110 and NDAC 120. Further, as illustrated by FIG. 1, the transceiver can include differential receiver 140 that can output receive (RX) data in response to being electrically coupled to a receive signal, e.g., RX signaling, via hybrid network 130. For example, differential receiver 140 can include a first input that is electrically coupled to a first resistor (not shown) of hybrid network 130. In addition, the transceiver can include a second input that is electrically coupled to a second resistor (not shown) of hybrid network 130.

Figure 2:
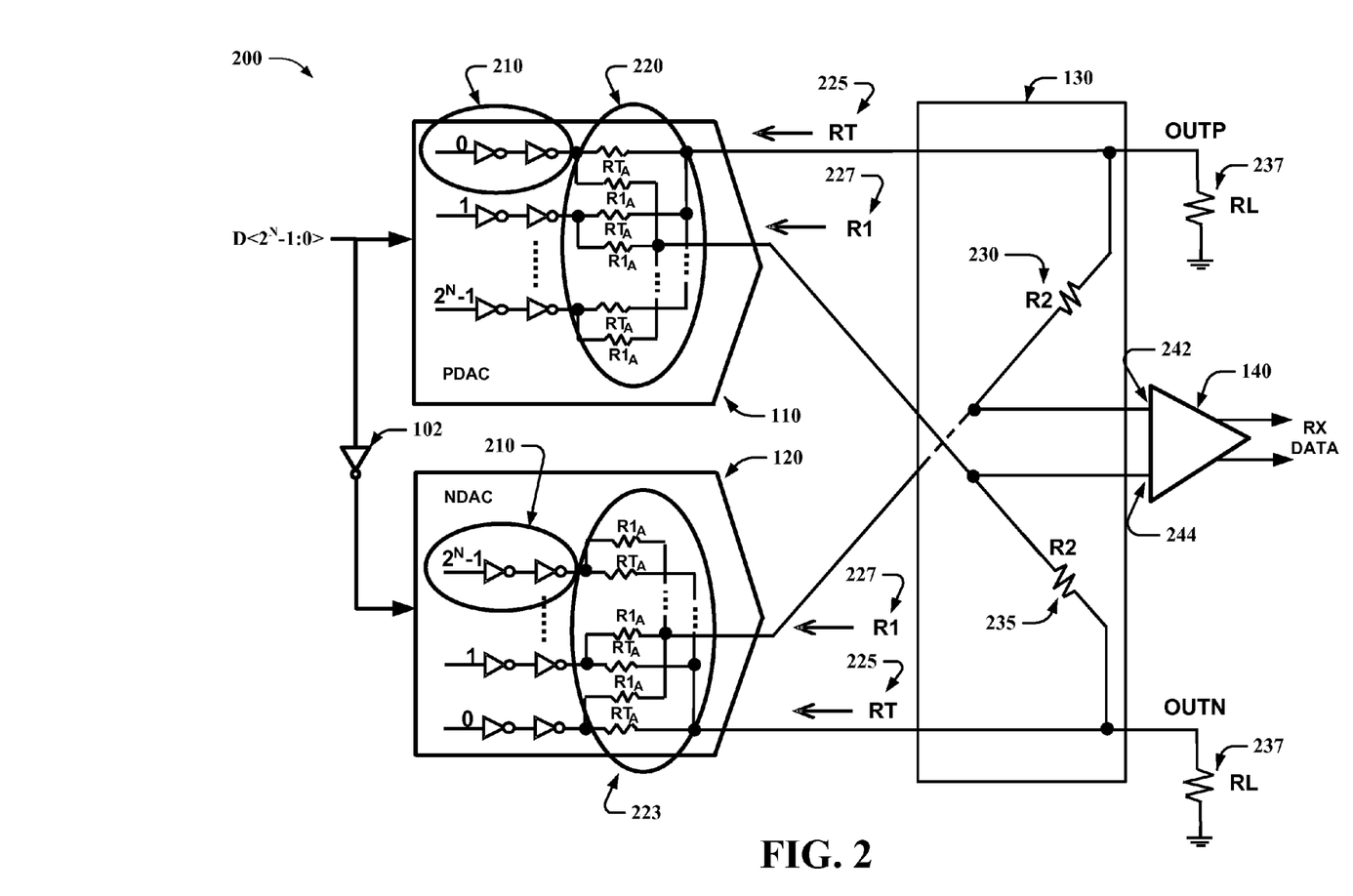
FIG. 2 illustrates a schematic of a differential resistive digital-to-analog converter (RDAC) circuit, in accordance with an embodiment.
Figure 3:
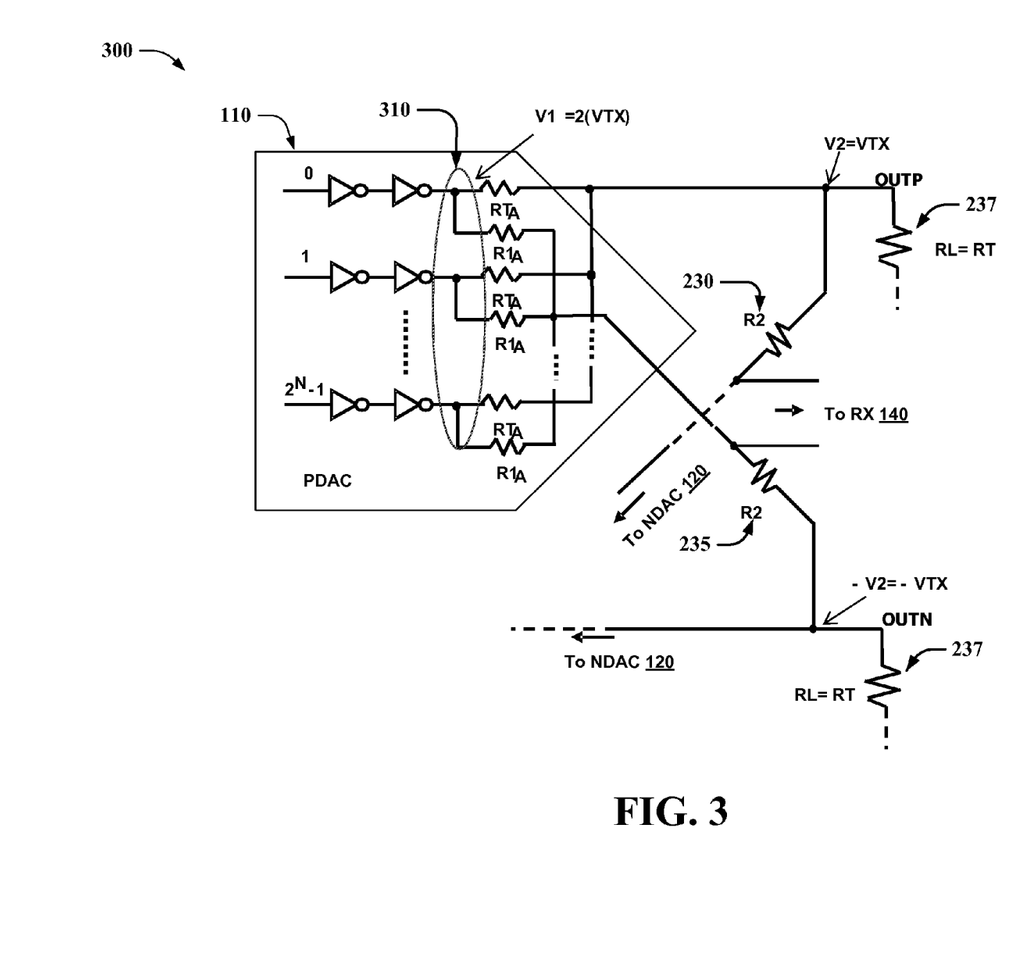
FIG. 3 illustrates voltages of an RDAC circuit, in accordance with an embodiment.
Figure 4:
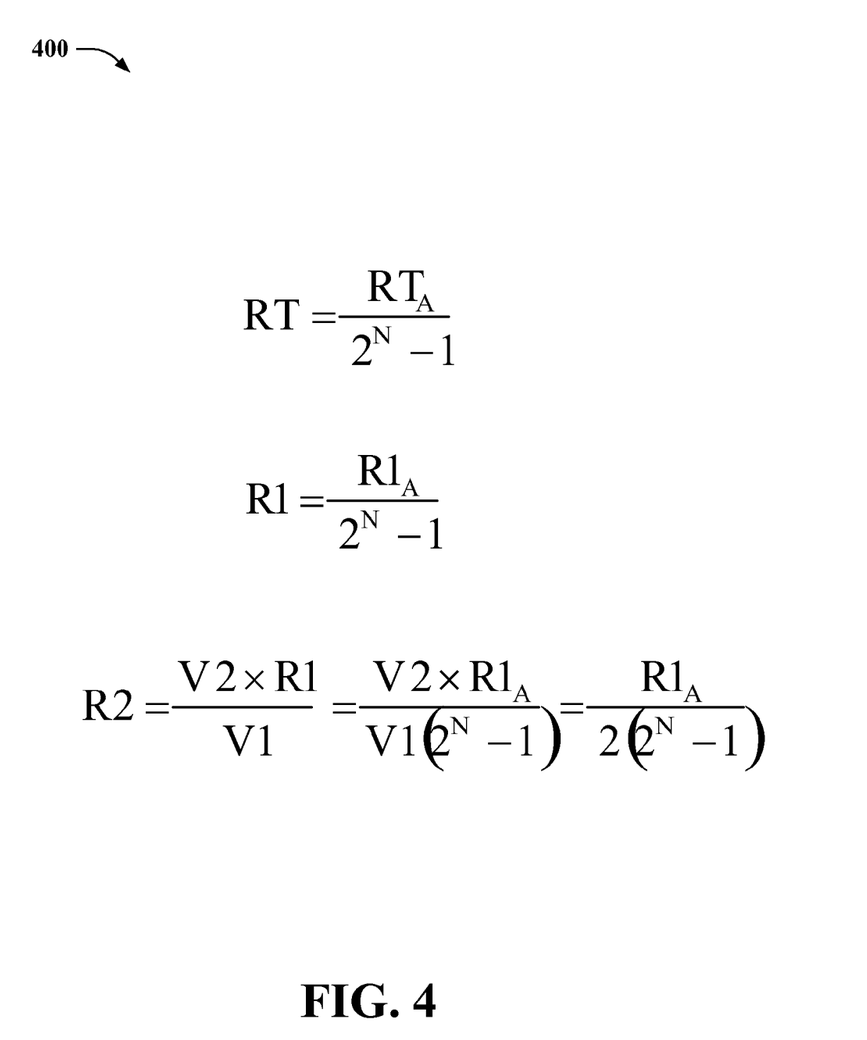
FIG. 4 illustrates equations associated with an RDAC circuit, in accordance with an embodiment.

Now referring to FIGS. 2-4, a schematic of a differential resistive digital-to-analog converter (RDAC) circuit 200, voltages 300 associated with RDAC circuit 200, and equations 400 associated with RDAC circuit 200 are illustrated, respectively, in accordance with various embodiments. As illustrated by FIG. 2, PDAC stage 110 can receive a first binary input, e.g., $D<2^N-1:0>$, which is electrically coupled to first network of resistors 220 via inverters 210. Further, NDAC stage 120 can receive a second binary input, e.g., $\sim D<2^N-1:0>$, which is inverted from, or a binary complement of, the first binary input and electrically coupled to second network of resistors 223 via inverters 210. It should be understood by a person of ordinary skill in the art having the benefit of the instant disclosure that NDAC stage 120 can receive the second binary input via a data bus (not shown) electrically coupled to a processor, computational device, etc. (not shown), without use of inversion stage 102.

A portion of first network of resistors 220 associated with Thevenin equivalent resistance 225 (RT) is electrically coupled to a positive output (OUTP) of RDAC circuit 200, which can be electronically coupled to load resistance 237 (RL). Further, a portion of second network of resistors 223 associated with Thevenin equivalent resistance 225 (RT) is electrically coupled to a negative output (OUTN) of RDAC circuit 200, which can be electronically coupled to load resistance 237 (RL). Further, another portion of first network of resistors 220 associated with Thevenin equivalent resistance 227 (R1) is electrically coupled to OUTN via resistor 235 (R2) of hybrid network 130. Additionally, another portion of second network of resistors 223 associated with Thevenin equivalent resistance 227 (R1) is electrically coupled to OUTP via resistor 230 (R2) of hybrid network 130.

It should be understood by a person of ordinary skill in the art having the benefit of the instant disclosure that one or more resistors illustrated in the accompanying drawings, although illustrated as single resistors, can be implemented with any number of resistors, e.g., electrically connected in series, electrically connected in parallel, etc.—such combinations of resistors having resistance values equivalent to resistance values of the illustrated single resistors.

First input 242 of differential receiver 140 can be electrically coupled to positive output OUTP via resistor 230 (R2), and second input 244 of differential receiver 140 can be electrically coupled to negative output OUTN via resistor 235. Now referring to FIGS. 3 and 4, differential output voltages (V2=VTX, −V2=−VTX) can be generated by RDAC circuit 200 at positive output OUTP and negative output OUTN, respectively, with respect to equations 400 when load resistance 237 (RL) is equivalent, or substantially equivalent, e.g., by a magnitude of less than or equal to 0.5%, to Thevenin equivalent resistance 225 (RT). As such, circuit nodes 310 are associated with voltage V1=2*(VTX).

Figure 5:
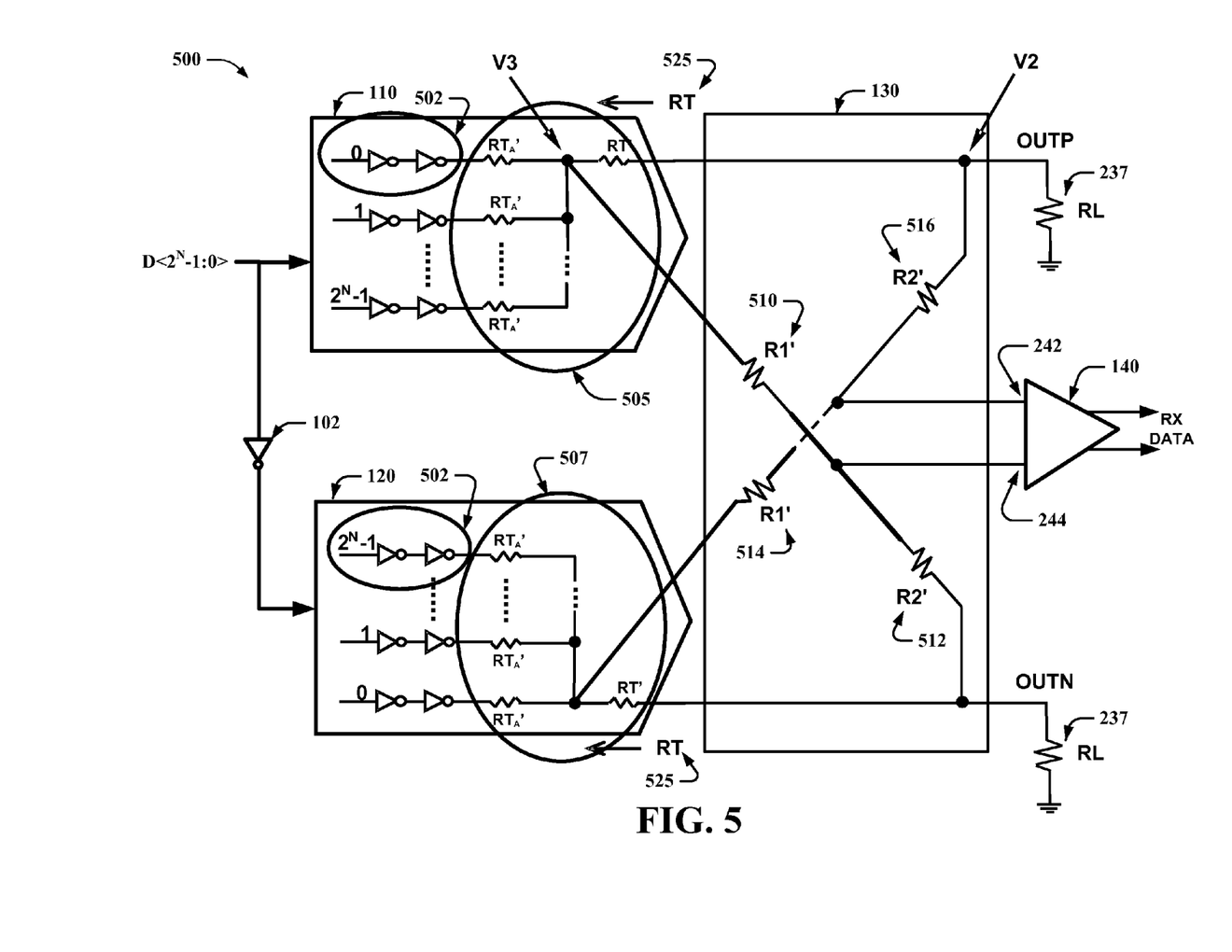
FIG. 5 illustrates a schematic of another RDAC circuit, in accordance with an embodiment.
Figure 6:
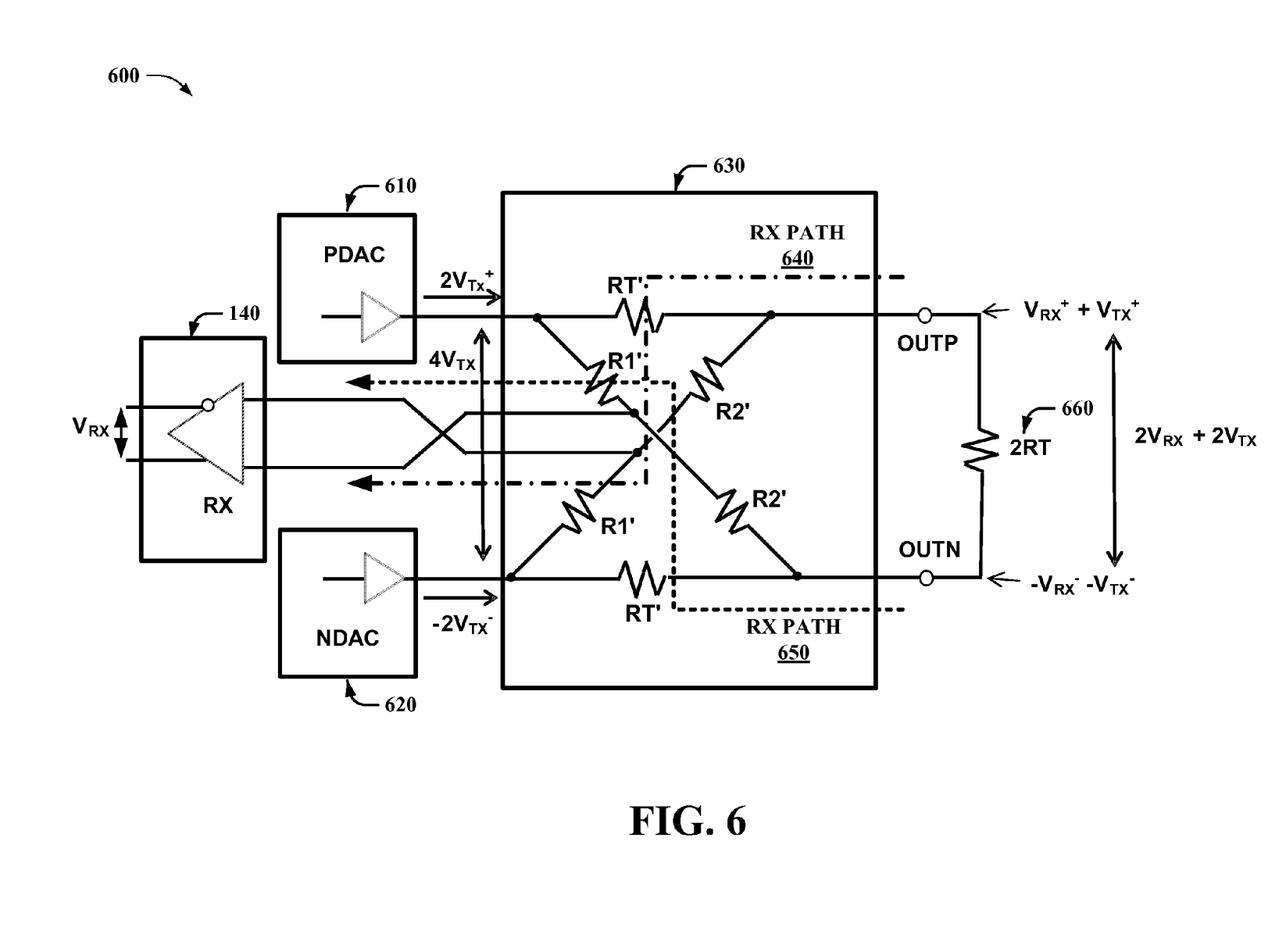
FIG. 6 illustrates voltages associated with an RDAC circuit, in accordance with various embodiments.
Figure 7:
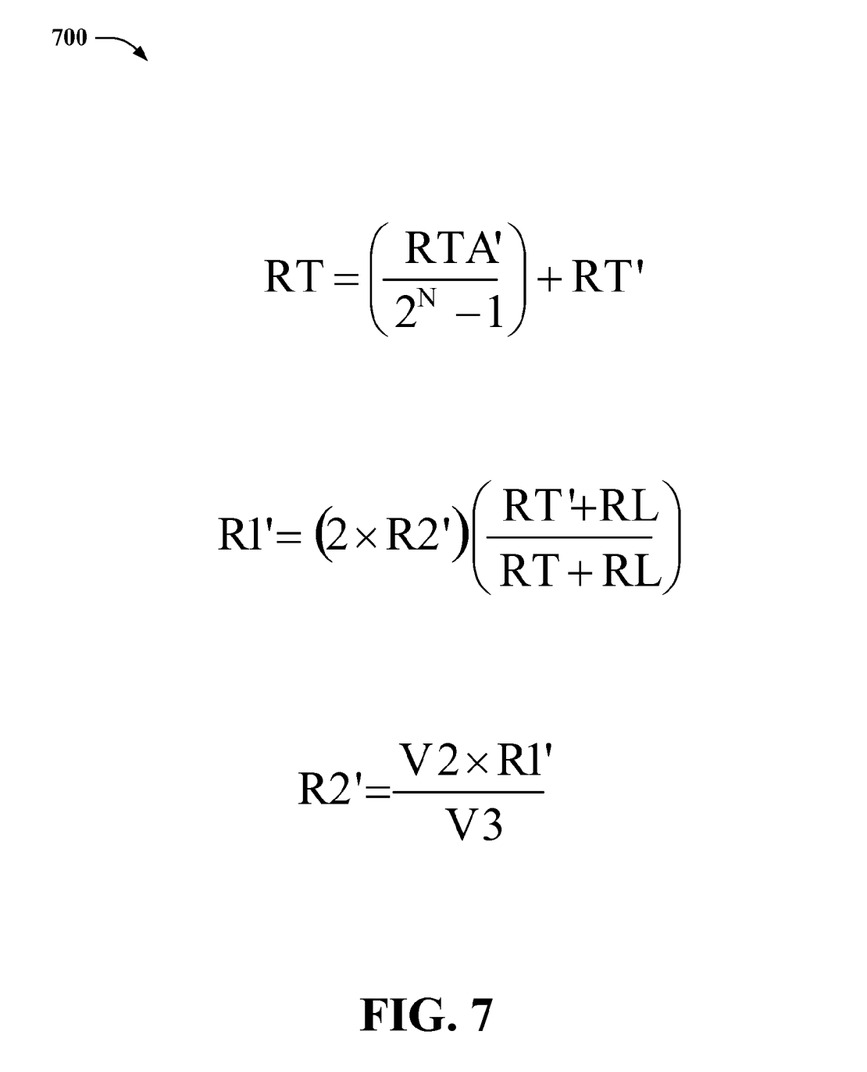
FIG. 7 illustrates equations associated with an RDAC circuit, in accordance with various embodiments.

Referring now to FIGS. 5-7, a schematic of another RDAC circuit (500), voltages associated with an RDAC circuit, and equations 700 associated with the RDAC circuit are illustrated, in accordance with an embodiment. As illustrated by FIG. 5, PDAC stage 110 can receive a first binary input, e.g., $D<2^N-1:0>$, which is electrically coupled to first network of resistors 505 via inverters 502. Further, NDAC stage 120 can receive a second binary input, e.g., $\sim D<2^N-1:0>$, which is inverted from, or a binary complement of, the first binary input and electrically coupled to second network of resistors 507 via inverters 502. It should be understood by a person of ordinary skill in the art having the benefit of the instant disclosure that NDAC stage 120 can receive the second binary input via a data bus (not shown) electrically coupled to a processor, computational device, etc. (not shown), without use of inversion stage 102.

A portion of first network of resistors 505 associated with Thevenin equivalent resistance 525 (RT) is electrically coupled to a positive output (OUTP) of RDAC circuit 500, which can be electronically coupled to load resistance 237 (RL). Further, a portion of second network of resistors 507 associated with Thevenin equivalent resistance 525 (RT) is electrically coupled to a negative output (OUTN) of RDAC circuit 500, which can be electronically coupled to load resistance 237 (RL). Further, another portion of first network of resistors 505 is electrically coupled to OUTN via resistor 510 (R1') of hybrid network 130 and resistor 512 (R2') of hybrid network 130 electrically coupled in series with resistor 510. Additionally, another portion of second network of resistors 507 is electrically coupled to OUTP via resistor 514 (R1') of hybrid network 130, which is electrically coupled in series with resistor 516 (R2') of hybrid network 130. Further, first input 242 of differential receiver 140 can be electrically coupled to positive output OUTP via resistor 516 (R2), and second input 244 of differential receiver 140 can be electrically coupled to negative output OUTN via resistor 512.

Referring now to FIGS. 6 and 7, voltages associated with RDAC circuits 500 and 600 (and RDAC circuit 800 described below), and equations associated with RDAC circuits 500 and 600 (and RDAC circuit 800 described below) are illustrated, respectively, in accordance with various embodiments. As illustrated by FIG. 6, RDAC circuit 600 can include PDAC stage 610, which can be, in various embodiments, equivalent to PDAC stage 110 of RDAC circuit 500 and/or RDAC circuit 800 described below, except termination resistor RT' of first network of resistors 505 (and 802 illustrated by FIG. 8) is included in hybrid network 630 for illustration purposes. As such, hybrid network 630 can be, in various embodiments, equivalent to hybrid network 130 of RDAC circuits 500 and 800, except inclusion of termination resistor RT' of first network of resistors 505 (and 802). Further, RDAC circuit 600 can include NDAC stage 620, which can be, in various embodiments, equivalent to PDAC stage 120 of RDAC circuit 500 (and RDAC circuit 800 described below), except termination resistor RT' of second network of resistors 507 (and 804 illustrated by FIG. 8) is included in hybrid network 630 for illustration purposes. As such, hybrid network 630 can be, in various embodiments, equivalent to hybrid network 130 of RDAC circuits 500 and 800, except inclusion of termination resistor RT' of second network of resistors 507 (and 804).

As illustrated by FIG. 6, a duplex voltage $V_{RX}^{+}+V_{TX}^{+}$ exists at positive output OUTP of RDAC circuit 600, and equivalently at RDAC circuits 500 and 800. Voltage $V_{TX}^{+}$ is generated by RDAC circuit 500, 600, 800, etc. Voltage $V_{RX}^{+}$ is generated by another transmitter circuit, e.g., a far-end transmitter circuit communicatively coupled to resistor 660. Further, an output voltage $-V_{RX}^{-}-V_{TX}^{-}$ exists at negative output OUTN of RDAC circuit 600, and equivalently at RDAC circuits 500 and 800, providing a magnitude of voltage across resistor 660 (2RT) of $2V_{RX}+2V_{TX}$. Furthermore, output voltages $2V_{TX}^{+}$ and $-2V_{TX}^{-}$ are generated by PDAC 610 and NDAC 620, respectively, and are electrically coupled to receive (RX) path 640 and RX path 650. Such voltages can be generated by RDAC circuits 500, 600, and 800 with respect to equations 700, e.g., when resistance values are equivalent, or substantially equivalent, e.g., by a magnitude of less than or equal to 0.5%, to respective resistances defined by equations 700.

Thus, echo cancelation of TX signal(s) leaking into RX path 640 and RX path 650 is performed by coupling portions of a passive hybrid resistive network, e.g., 630, 130, etc. between a transmit path associated with outputs of PDAC stage 110, PDAC stage 610, NDAC stage 120, NDAC stage 620, etc. and inputs of differential receiver 140 via RX path 640 and RX path 650. As such, RDAC circuits, e.g., 500, 600, 800, etc. described herein in various embodiments can reduce power consumption of associated transceivers and reduce device area associated with such transceivers.

Figure 8:
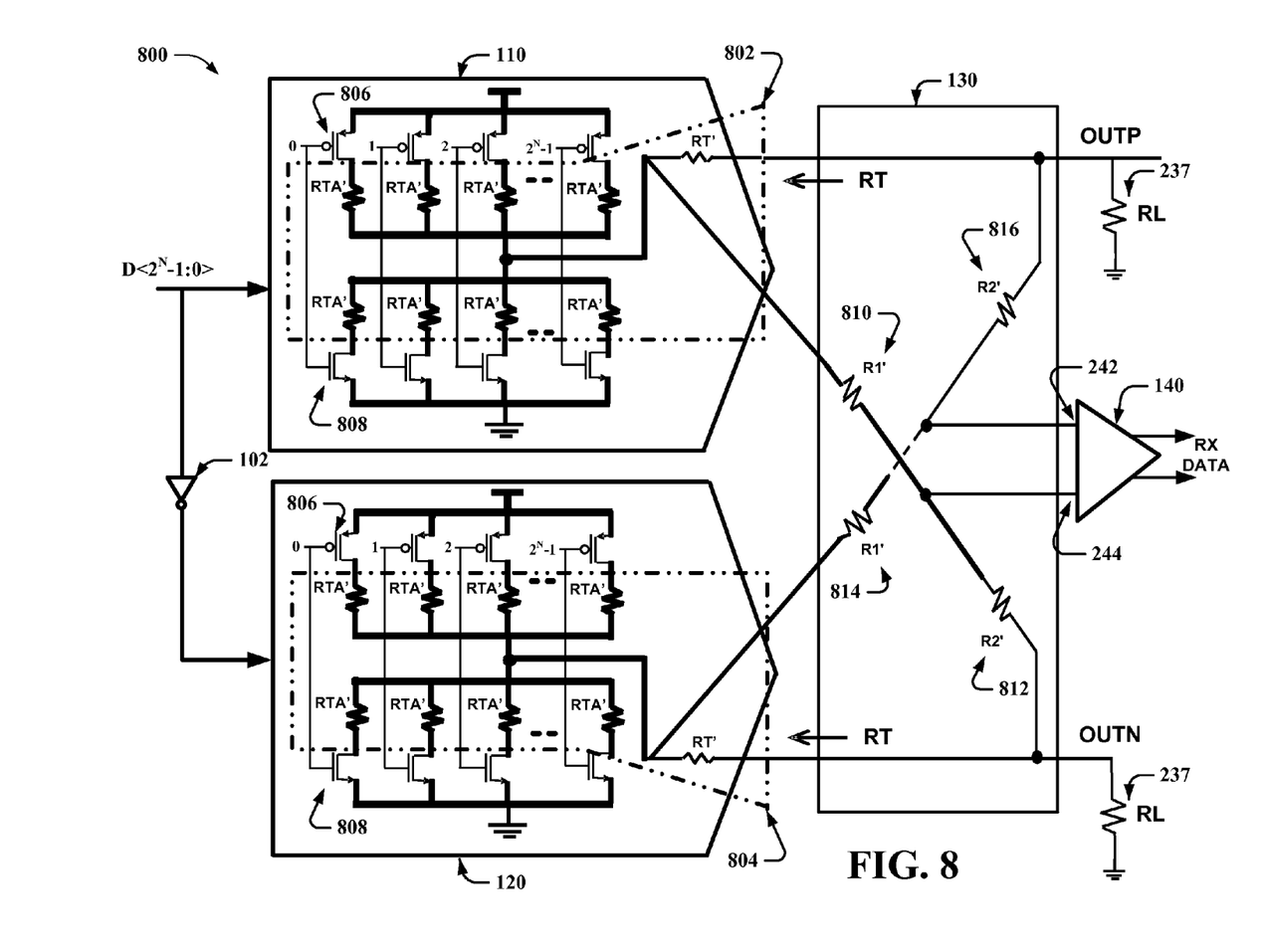
FIG. 8 illustrates a schematic of an RDAC circuit including metal-oxide-semiconductor field-effect transistors (MOSFETs), in accordance with an embodiment.

FIG. 8 illustrates a schematic of RDAC circuit 800 including MOSFETs, in accordance with an embodiment. As illustrated by FIG. 8, PDAC stage 110 can receive a first binary input, e.g., $D<2^{N}-1:0>$, which is electrically coupled to first network of resistors 802 via pMOSFETs (e.g. 806). For example, pMOSFET 806, a drain of pMOSFET 806, etc. is electrically coupled in series with a resistor, e.g., of resistance value RTA', of first network of resistors 802. Further, the first binary input is electrically coupled to first network of resistors 802 via nMOSFETs (e.g., 808). For example, nMOSFET 808, a drain of nMOSFET 808, etc. is electrically coupled in series with another resistor, e.g., of resistance value RTA', of first network of resistors 802. Additionally, a portion of first network of resistors 802 electrically coupled to the resistor and the other resistor is electrically coupled in series with yet another resistor (RT'), which is electrically coupled to resistor 237 (RL) at positive output OUTP.

Further, NDAC stage 120 can receive a second binary input, e.g., $\sim D<2^{N}-1:0>$, which is inverted from, or a binary complement of, the first binary input and electrically coupled to second network of resistors 804 via pMOSFETs (e.g. 806). For example, pMOSFET 806, a drain of pMOSFET 806, etc. is electrically coupled in series with a resistor, e.g., of resistance value RTA', of second network of resistors 804. Further, the second binary input is electrically coupled to second network of resistors 804 via nMOSFETs (e.g., 808). For example, nMOSFET 808, a drain of nMOSFET 808, etc. is electrically coupled in series with another resistor, e.g., of resistance value RTA', of second network of resistors 804.

Additionally, a portion of second network of resistors 804, electrically coupled to the resistor and the other resistor, is electrically coupled in series with yet another resistor (RT'), which is electrically coupled to resistor 237 (RL) at negative output OUTN. It should be understood by a person of ordinary skill in the art having the benefit of the instant disclosure that NDAC stage 120 can receive the second binary input via a data bus (not shown) electrically coupled to a processor, computational device, etc. (not shown), without use of inversion stage 102.

A portion of first network of resistors 802 associated with Thevenin equivalent resistance RT is electrically coupled to positive output OUTP. Further, a portion of second network of resistors 804 associated with Thevenin equivalent resistance RT is electrically coupled to negative output OUTN. Additionally, another portion of first network of resistors 802 is electrically coupled to OUTN via resistor 810 (R1') of hybrid network 130, which is electrically coupled in series with resistor 812 (R2') of hybrid network 130. Further, another portion of second network of resistors 804 is electrically coupled to OUTP via resistor 814 (R1') of hybrid network 130, which is electrically coupled in series with resistor 816 (R2') of hybrid network 130. Furthermore, first input 242 of differential receiver 140 can be electrically coupled to positive output OUTP via resistor 816 (R2), and second input 244 of differential receiver 140 can be electrically coupled to negative output OUTN via resistor 812.

Figure 9:
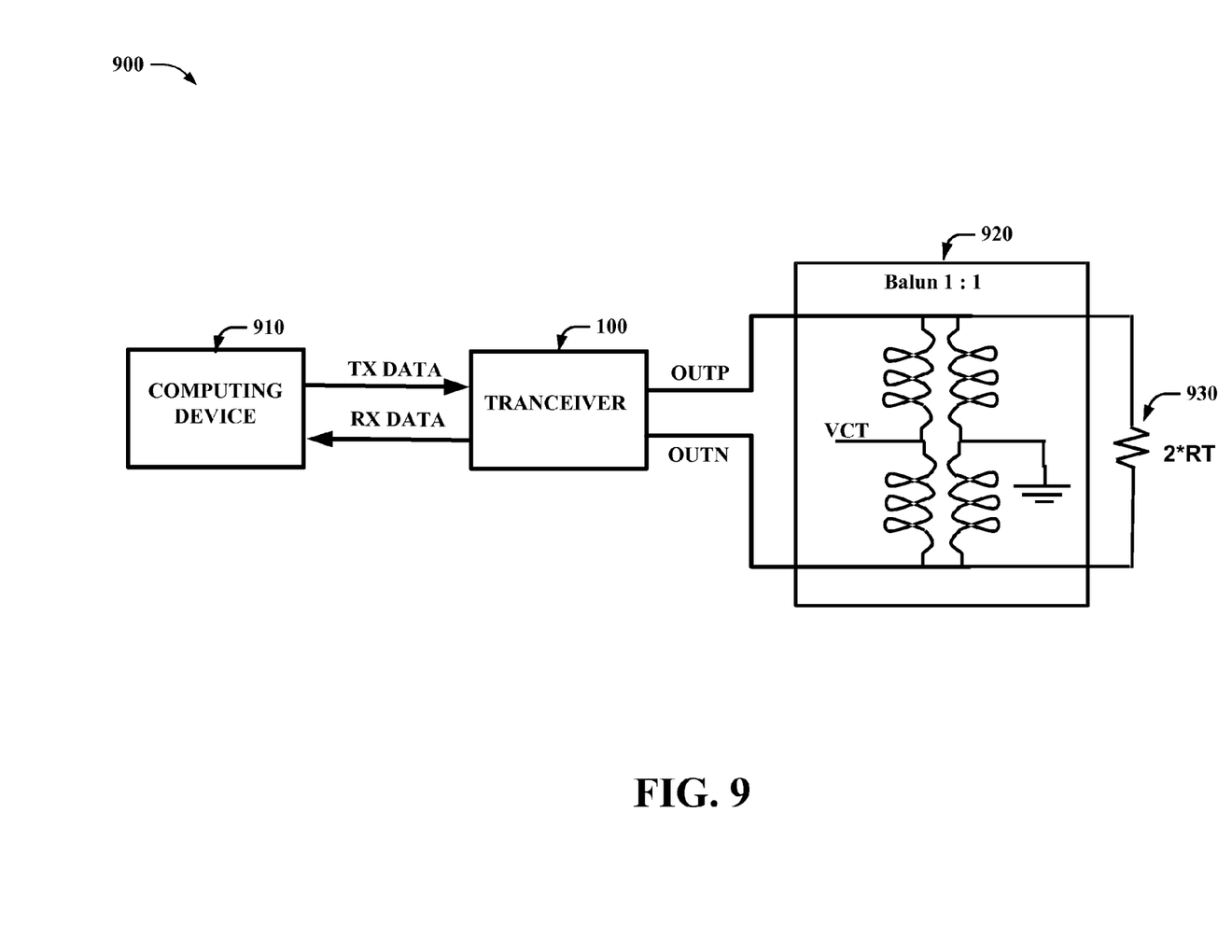
FIG. 9 illustrates a system including a transceiver, in accordance with various embodiments.

Referring now to FIG. 9, a system 900 including a transceiver 100, e.g., a Gigabit Ethernet (Gbe, 1GigE, IEEE 802.3-2008 based, etc.) transceiver, a very high speed digital subscriber line (VDSL) based transceiver, etc. is illustrated, in accordance with various embodiments. Transceiver 100 can receive TX data from computing device 910, e.g. a processor, a computational system, a device, etc. including a first portion of binary data and a second portion of binary data that is a binary complement of, or inverted from, the first portion of binary data. In such an embodiment, NDAC 120 can receive the second portion of binary data without utilizing inversion stage 102. Further, transceiver 100 can be electronically coupled to balun 920, generating a differential TX signal across line load 930, e.g., of resistance 2*RT, based on the TX data received from computing device 910.

Additionally, transceiver 100 can receive a differential RX signal across line load 930 via OUTP and OUTN (see e.g. RX path 640 and RX path 650 illustrated by FIG. 6 described above), and perform echo cancelation of TX signal(s) utilizing a passive hybrid resistive network, e.g., hybrid network 130, electrically coupled to RX path 640 and RX path 650. As such, transceiver 100 can reduce power consumption of system 900, and reduce a size of a die, integrated circuit, discrete circuit, etc. associated with system 900. Further, computing device 910 can receive RX data from transceiver 100 according to the differential RX signal.

The terms "first," "second," "third," "fourth," and the like may be used for distinguishing between similar elements and not necessarily for describing a particular sequential or chronological order. Furthermore, the terms "comprise," "include," "have," and any variations thereof, are intended to cover non-exclusive inclusions, such that an article, an apparatus, component, or composition that comprises a list of elements is not necessarily limited to those elements, but may include other elements not expressly listed or inherent to such article, apparatus, component, or composition.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" or "at least one" unless specified otherwise or clear from context to be directed to a singular form. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

The words "example" or "exemplary" are used herein to mean serving as an example, instance, or illustration. Any aspect or design described herein as "exemplary" is not necessarily to be construed as preferred or advantageous over other aspects or designs, nor is it meant to preclude equivalent exemplary structures and techniques known to those of ordinary skill in the art. Rather, use of the word exemplary is intended to present concepts in a concrete fashion. For the avoidance of doubt, the subject matter of the various different embodiments disclosed herein are not limited by such examples.

Some of the aforementioned embodiments have been described with respect to interaction between several circuits, circuit components, components, etc. that can be, e.g., included in a semiconductor, an integrated circuit, etc. It can be appreciated that such components can include those components or specified sub-components, some of the specified components or sub-components, and/or additional components, and according to various permutations and combinations of the foregoing. Sub-components can also be implemented as components electrically coupled to other components rather than included within parent components (hierarchical). Additionally, it is to be noted that one or more components may be combined into a single component providing aggregate functionality or divided into several separate sub-components, and that any one or more middle layers or components, may be provided to couple to such sub-components in order to provide integrated functionality. Any components described herein may also interact with one or more other components not specifically described herein but generally known by those of skill in the art.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A transceiver, comprising:
   a differential resistor-based digital-to-analog converter (RDAC) including a positive digital-to-analog converter (PDAC) stage and a negative digital-to-analog converter (NDAC) stage, wherein a first network of resistors of the PDAC stage is electrically coupled to a second network of resistors of the NDAC stage utilizing an intermediary network of resistors; and
   a differential receiver including a first input and a second input, wherein the first input is electrically coupled to a first resistor of the intermediary network of resistors, and wherein the second input is electrically coupled to a second resistor of the intermediary network of resistors.

2. The transceiver of claim 1, wherein a portion of the first network of resistors is electrically coupled to a positive output of the RDAC, and wherein another portion of the second network of resistors is electrically coupled to a negative output of the RDAC.

3. The transceiver of claim 1, wherein a portion of the first network of resistors is electrically coupled to a negative output of the RDAC via the intermediary network of resistors, and wherein another portion of the second network of resistors is electrically coupled to a positive output of the RDAC via the intermediary network of resistors.

4. The transceiver of claim 1, wherein the first resistor is electrically coupled to a positive output of the RDAC, and wherein the second resistor is electrically coupled to a negative output of the RDAC.

5. The transceiver of claim 1, wherein the PDAC stage receives a first binary input that is electrically coupled to the first network of resistors, wherein the NDAC stage receives a second binary input that is electrically coupled to the second network of resistors, and wherein the first binary input is inverted from the second binary input.

6. The transceiver of claim 5, wherein a bit of the first binary input is electrically coupled to the first network of resistors utilizing a series of inverters.

7. The transceiver of claim 5, wherein a bit of the second binary input is electrically coupled to the second network of resistors utilizing a series of inverters.

8. The transceiver of claim 5, wherein a bit of the first binary input is electrically coupled to a first resistor of the first network of resistors utilizing a p-channel metal-oxide-semiconductor field-effect transistor connected in series with the first resistor.

9. The transceiver of claim 5, wherein a bit of the first binary input is electrically coupled to a first resistor of the first network of resistors utilizing an n-channel metal-oxide-semiconductor field-effect transistor connected in series with the first resistor.

10. The transceiver of claim 1, wherein the intermediary network of resistors includes a third resistor electrically coupling the first network of resistors to the second resistor.

11. A semiconductor device, comprising:
   a differential resistive digital-to-analog converter (RDAC) circuit including a positive digital-to-analog converter (PDAC) circuit that includes a first set of resistors, and a negative digital-to-analog converter (NDAC) circuit that includes a second set of resistors that is electrically coupled to the first set of resistors via an intermediary set of resistors; and
   a differential receiver circuit including a first input electrically coupled to a first resistor of the intermediary set of resistors, and a second input is electrically coupled to a second resistor of the intermediary set of resistors.

12. The semiconductor device of claim 11, wherein the first resistor is electrically coupled to a positive output of the RDAC circuit, wherein the positive output is electrically coupled to the first set of resistors, wherein the second resistor is electrically coupled to a negative output of the RDAC circuit, wherein the negative output is electrically coupled to the second set of resistors.

13. The semiconductor device of claim 11, wherein the PDAC circuit electrically couples a first binary input to the first set of resistors, wherein the NDAC circuit electrically couples a second binary input to the second set of resistors, and wherein the first binary input is inverted from the second binary input.

14. The semiconductor device of claim 13, wherein the PDAC circuit electrically couples the first binary input to the first set of resistors using a series of inverters, and wherein the NDAC circuit electrically couples the second binary input to the second set of resistors using another series of inverters.

15. The semiconductor device of claim 11, wherein a bit of the first binary input is electrically coupled to a resistor of the first set of resistors utilizing at least one of a p-channel metal-oxide-semiconductor field-effect transistor electrically connected in series with the resistor or an n-channel metal-oxide-semiconductor field-effect transistor electrically connected in series with the resistor.

16. A wireline transceiver, comprising:
   a first digital-to-analog converter of a differential resistive digital-to-analog converter (RDAC) circuit including a first group of resistors;
   a second digital-to-analog converter of the RDAC circuit including a second group of resistors that is electrically coupled to the first group of resistors utilizing a third group of resistors; and
   a receiver circuit including a first input and a second input, wherein the first input is electrically coupled to a first resistor of the intermediary set of resistors, and wherein the second input is electrically coupled to a second resistor of the intermediary set of resistors.

17. The wireless transceiver of claim 16, wherein the first resistor is electrically coupled to a positive output of the RDAC circuit, and wherein the second resistor is electrically coupled to a negative output of the RDAC circuit.

18. The wireless transceiver of claim 16, further comprising:
   a first binary input that is electronically coupled to the first group of resistors; and
   a second binary input that is electronically coupled to the second group of resistors, wherein the first binary input is inverted from the second binary input.

19. The wireless transceiver of claim 16, wherein the first binary input is electrically coupled to the first group of resistors via a series of inverters, and wherein the second binary input is electrically coupled to the second group of resistors via another series of inverters.

20. The wireless transceiver of claim 16, wherein the first binary input is electrically coupled to the first group of resistors via a p-channel metal-oxide-semiconductor field-effect transistor electrically connected in series with a resistor of the first group of resistors and an n-channel metal-oxide-semiconductor field-effect transistor electrically connected in series with another resistor of the first group of resistors.

* * * * *